(12) United States Patent
Blanc et al.

(10) Patent No.: US 6,366,163 B2
(45) Date of Patent: Apr. 2, 2002

(54) VIDEO PREAMPLIFIER

(75) Inventors: Jean-Pierre Blanc, Theys; Michel Barou, Voreppe, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/771,247

(22) Filed: Jan. 26, 2001

(30) Foreign Application Priority Data

Jan. 31, 2000 (FR) .............................................. 00 01213

(51) Int. Cl.[7] .................................................. G06G 7/12
(52) U.S. Cl. ........................................ 327/563; 327/77
(58) Field of Search ..................... 327/77, 89, 560–563, 327/52, 53, 63, 65, 66; 330/252, 254, 281

(56) References Cited

U.S. PATENT DOCUMENTS

| | | | | |
|---|---|---|---|---|
| 4,868,418 A | * | 9/1989 | Imamura et al. ............... | 327/77 |
| 5,365,120 A | * | 11/1994 | Main ........................... | 327/77 |
| 5,600,275 A | | 2/1997 | Garavan ....................... | 327/307 |
| 5,808,501 A | | 9/1998 | Ivanov ......................... | 327/333 |
| 6,208,199 B1 | * | 3/2001 | Andersson .................... | 327/561 |

OTHER PUBLICATIONS

French Search Report from French Patent Application 00/01213, filed Jan. 31, 2000.
Baschirotto A. et al.: "High Speed BICMOS Operational Amplifier For Switched–Capacitor Circuits" Proceedings Of The International Symposium on Circuits And Systems (ISCS), US, New York, IEEE, vol.–, 1993, pp. 998–1001.
T.L. Viswanathan: "CMOS Transconductance Element" Proceedings of the IEEE, vol. 74, No. 1, Jan. 1986, pp. 222–224, IEEE New York US.

* cited by examiner

Primary Examiner—Toan Tran
(74) Attorney, Agent, or Firm—Wolf, Greenfield & Sacks, P.C.; James H. Morris

(57) ABSTRACT

A preamplifier including an input stage adapted to receiving an analog signal via a connection capacitor, and a differential output stage adapted to providing the signal referenced with respect to a predetermined level, and circuitry for enabling the input stage to accept a signal referenced to the differential stage ground, the signal provided by the output stage being referenced to this ground.

10 Claims, 3 Drawing Sheets

VIDEO PREAMPLIFIER

BACKGROUND OF THE INVENTION

1. Field of the Invention

The present invention relates to the field of video image display and, more specifically, to a video signal preamplifier intended to be interposed between a composite video signal source (RGB+synchronization signals) and a signal amplifier for a monitor. The preamplifier to which the present invention relates is intended for receiving analog signals.

2. Discussion of the Related Art

FIG. 1 very schematically shows a conventional example of a video display signal including a preamplifier of the type to which the present invention relates. A video source 1 formed, for example, of a graphics board of a microcomputer, provides video signals for a display monitor. The signals provided by source 1 basically include a video signal including the three RGB color component data, synchronization signals, and a so-called "blanking" signal (BLK) for setting a reference level between two display windows. Before being able to be displayed on a monitor screen 2 while being exploited by the processing circuits of this monitor, the video signals must be submitted to an analog processing generally including, successively, a level shifting in a circuit 3 (CLAMP), a preamplification within a circuit 4 and finally an amplification in a circuit 5. The function of amplifier 5 only is to amplify the video signal at the end of the processing by circuits 3 and 4. The function of preamplifier 4 is, in addition to preamplifying the video signal (the gain of amplifier 5 being insufficient), to set the base level of the video signal. The function of clamp 3 is to set the voltage level of the video signal to enable it to drive the preamplifier. This setting is performed outside of the display windows, for example, during line and frame flybacks. Circuit 3 receives, for this purpose, line flyback and frame flyback synchronization signal Hsync. Preamplifier 4 receives a reference voltage level that depends on the reference of the video signal at the input of this preamplifier, as will be seen hereafter. It should be noted that the RGB video signals transit through a connection capacitor C to isolate source 1 from the rest of the monitor. Circuits 3, 4, and 5 belong to the conventional analog processings of a video monitor. Generally, the input impedance of the monitor is standardized and determined by a resistor (R) between a first electrode of capacitor C and the ground. It should be noted that signals other than the RGB signal are provided to the monitor.

The different analog processings of the monitor within circuits 3, 4, and 5 have as a main function, in addition to signal amplification, ensuring the alignment of the video signal and to analogically transmit the video. More specifically, preamplifier 4 has, in addition to the function of amplifying the signal due to the insufficient gain of amplifier 5, that of determining a so-called black level Vb of the video signal as well as a signal V0 of this signal during line flyback and frame flyback periods.

FIGS. 2A, 2B, and 2C illustrate, in the form of simplified timing diagrams, an example of operation of an analog processing circuit of a video monitor such as illustrated in FIG. 1. FIG. 2A shows an example of shape of an RGB signal formed of analog voltage levels during display windows between two line flybacks. FIG. 2B shows the shape of a blanking signal BLK including pulses between two display windows. In FIG. 2B, it is assumed that all the stages (pulses) of signal BLK occur during line flybacks (or frame flybacks) having generally longer durations. FIG. 2C illustrates an example of the shape of signal V out provided by preamplifier 4. Signal V out reproduces the analog levels of the RGB signal now aligned on black level Vb and mixed with the stages of signal BLK that are restored in a level V0.

Levels Vb and V0 are set within preamplifier 4 to set the levels of the constant monitor control information. In particular, as previously indicated, level Vb determines the black level of the monitor.

The operation of the monitor circuits being perfectly well known, it will not be further detailed. Only the elements that will subsequently enable better understanding an example of application of the present invention and its advantages have been illustrated and discussed.

FIG. 3 shows, still schematically and in the form of blocs, the portion of the analog processing circuit of FIG. 1 which is more specifically associated with the video preamplifier input stage. As illustrated in FIG. 3, a preamplifier (4, FIG. 1) is essentially formed of a differential stage 6 (DIFF) providing signal V out and receiving, as differential inputs, reference level Vref and a signal V out coming from an input stage 7 (IN) of the preamplifier. Input stage 7 especially has the function of adapting the level of the input signal to the input impedance of stage 6. Input stage 7 receives video signal RGB of clamp 3, the function of which is to place the level of the preamplifier input signal at voltage Vref when the video signal is low, that is, during the periods of horizontal synchronization pulses (signal Hsync), and thus to place the input at the reference level outside the display windows. As illustrated in FIG. 3, differential circuit 6 receives level data Vb, V0 as well as signal BLK, which must be combined with the RGB signal to form signal V out.

Input stage 7 of a video preamplifier is a portion of the signal which is particularly important. Indeed, it is the first link of an analog processing chain that must have good performance in terms of rapidity and linearity. Conventionally, the ROB signal must be aligned with respect to level Vref to have sufficient voltage drops in the preamplifier. A bipolar technology is generally used within clamp 3 and input stage 7. In practice, the input level is compared to level Vref to control the passing of a current through a bipolar transistor of circuit 3, that is, to recharge or discharge capacitor C during horizontal synchronization periods Hsync to set level Vref during these periods. A problem that is posed in conventional circuits using bipolar transistors is that the high current need in the preamplifier tends to shift the voltage level of capacitor C since the base current of the bipolar transistor driving the differential stage is not negligible. A solution would be to increase the gain of this transistor. However, an increase of the input transistor gain introduces a decrease of its switching speed.

Another problem of conventional circuits is that, in the case where there is no synchronization signal, the shaping switch used to discharge or charge capacitor C must be closed for the input signal to then be at the reference level, so that differential stage 6 detects no level difference with respect to its other input. The existence of a base current of the transistor causes a charge of the input capacitor, which progressively causes the transmission of a white information level to the display amplifier, while the monitor must remain black.

It would be desirable to be able to align the input RGB video signal of the differential stage with respect to ground. This would enable, among other things, accelerating the response of the preamplifier stage, to provide reduced power consumption. In a conventional bipolar transistor circuit, such a solution is not possible since the leakage resistor that would then be required to discharge the input capacitor would generate a permanent decrease of the level of this charge and, accordingly, a distortion of the white level of the displayed image.

SUMMARY OF THE INVENTION

The present invention aims at providing a novel video preamplifier that overcomes the disadvantages of known systems and, in particular, that enables aligning the input video signal with respect to ground.

The present invention also aims at providing a solution that maintains the rapidity and linearity of the preamplifier.

More generally, the present invention aims at providing a differential preamplifier including an input stage intended for receiving an analog signal through a connection or isolation capacitor.

To enable aligning the input signal with respect to ground, it is necessary to use a follower-mounted MOS transistor as the preamplifier input stage. The use of a MOS transistor also enables a null input current control, which is an unquestionable advantage in terms of charge hold of input capacitor C, which was a problem of conventional solutions.

Thus, a first feature of the present invention is to provide a video preamplifier including, as an input stage, a follower-mounted PMOS transistor.

More specifically, the present invention provides a preamplifier including an input stage adapted to receiving an analog signal via a connection capacitor, and a differential output stage adapted to providing said signal referenced with respect to a predetermined level, including means for enabling the input stage to accept a signal referenced to the differential stage ground, the signal provided by the output stage being referenced to this ground.

According to an embodiment of the present invention, the input stage includes a first MOS transistor, the gate of which receives said input signal referenced to ground, in series with a first current source, the midpoint between said current source and said transistor defining the output terminal of the preamplifier input stage.

According to an embodiment of the present invention, the preamplifier includes a switching means for drawing the output of the input stage to the ground.

According to an embodiment of the present invention, said switching means is formed of a second transistor, the control terminal of which is connected to the drain of the first input MOS transistor.

According to an embodiment of the present invention, the preamplifier includes means for setting, in static operation, the gate-source voltage of the first MOS transistor to a predetermined value.

According to an embodiment of the present invention, said means is formed of a second current source, connected between the drain of the first MOS transistor and the ground, this second source being connected as a current mirror on a third current source, the current of which is determined by a third MOS transistor with a constant gate-source voltage.

According to an embodiment of the present invention, said second transistor is an NPN-type transistor as well as transistors constitutive of the second and third current sources, the first current source being formed of a PNP-type bipolar transistor.

According to an embodiment of the present invention, the currents of the first and second sources are linked to each other via a current mirror assembly.

According to an embodiment of the present invention, the preamplifier includes a stabilization capacitor between the source and the drain of the first MOS transistor.

According to an embodiment of the present invention, preamplifier is applied to a circuit for processing a video signal analog processing.

The foregoing objects, features and advantages of the present invention, will be discussed in detail in the following non-limiting description of specific embodiments in connection with the accompanying drawings.

DETAILED DESCRIPTION

Figure 1:
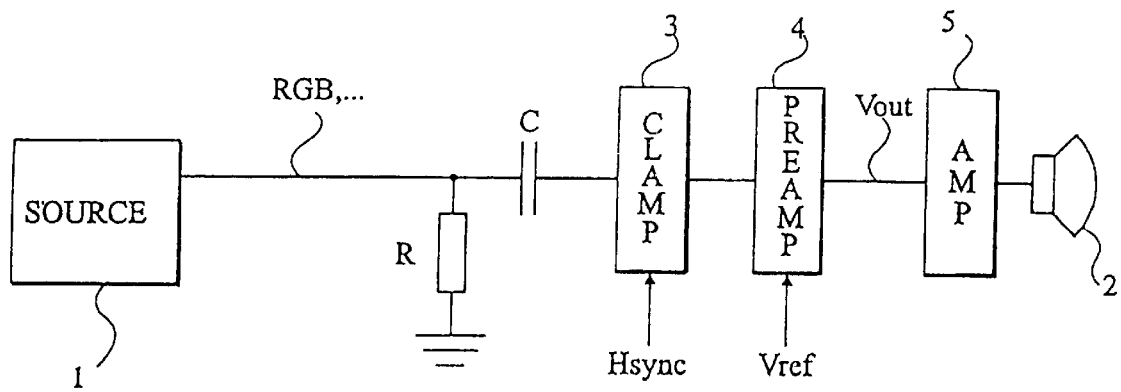
FIGS. 1, 2A, 2B, 2C, and 3, previously described, are meant to show the state of the art and the problem to solve.

The same elements have been designated by the same references in the different drawings. For clarity, only those elements that are necessary to the understanding of the present invention have been shown in the drawings and will be described hereafter. In particular, the respective structures of the analog processing circuits, be it the clamp upstream of the preamplifier to which the present invention applies or the downstream amplifier, have not been detailed. Similarly, the details constitutive of the differential stage of the preamplifier of the present invention are conventional and will not be detailed. Only the input stage of this preamplifier will be discussed in detail hereafter, the possible adaptation of the other components of the analog processing circuits being within the abilities of those skilled in the art.

Figure 2A:
Figure 2B:
Figure 2C:
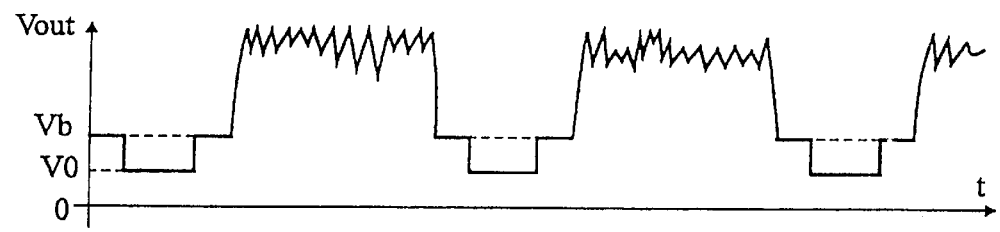
Figure 3:
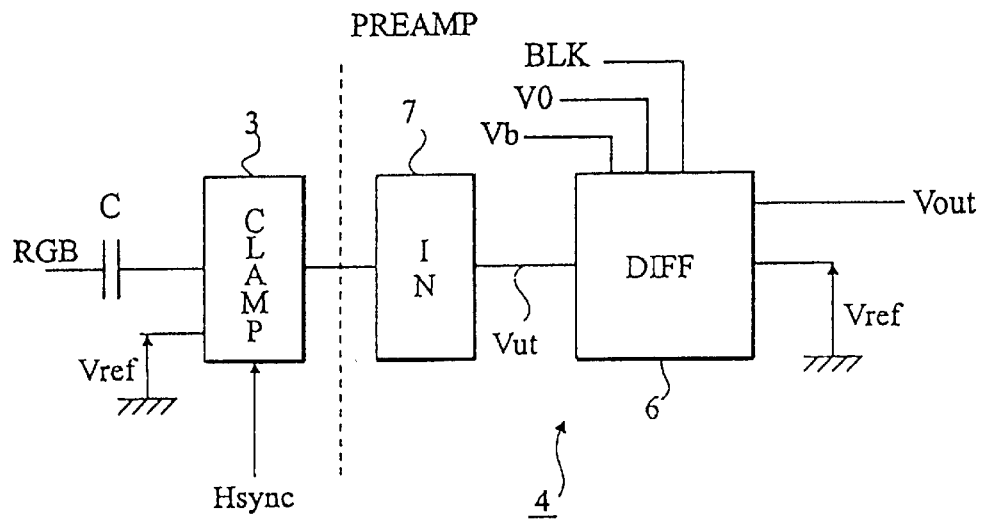
Figure 4:
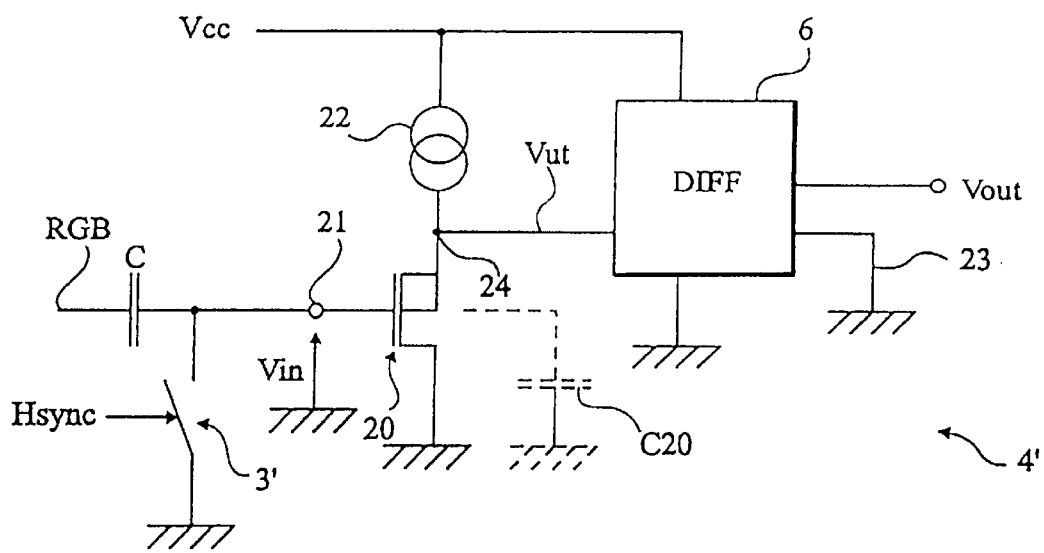
FIG. 4 schematically shows an embodiment of a preamplifier provided, as an input stage, with a PMOS transistor.

FIG. 4 schematically shows a preamplifier 4' of a video signal including, as an input stage, a PMOS transistor 20, gate 21 of which is intended for receiving a signal Vin and the source of which provides a desired signal Vut to a differential stage 6 of the preamplifier. Differential stage 6 is supplied by a supply voltage Vcc of preamplifier 4'. A current source 22 connects the source of transistor 20 to voltage Vcc. The drain of PMOS transistor 20 is grounded. As previously, preamplifier ' must provide a video signal Vout of the type illustrated in FIG. 2C. It thus receives at least voltage levels Vb and V0 as well as blanking signal BLK. These signals have not been shown in FIG. 4 for clarity. It should be noted that voltage levels Vb and V0 can be made available at the level of preamplifier ', either directly in the form of voltage references, or via means (for example, potentiometric means) for setting a reference voltage.

It should be noted that, according to the present invention, differential stage ' no longer needs a reference input at a specific level. Indeed, according to the present invention, this reference level now is the ground. As will be seen hereafter, an assembly similar to that which will be discussed hereafter in relation with FIG. 5 will preferably be used on the side of reference differential input 23, for reasons of symmetry of the assembly.

As illustrated in FIG. 4, the shaping block 3' of a circuit of the present invention includes a switch controlled by the synchronization signal and this switch grounds input terminal 21 during the periods when the video signal is not present. Transistor 20 then is on, which brings level Vut substantially down to ground (plus gate-source voltage drop Vgs of transistor 20). A first advantage of the present invention should here be noted, which is to maintain a black level of the monitor in the absence of a control signal for clamp 3', that is, in the absence of a synchronization signal. Circuit 3' is simplified with respect to a conventional circuit since no voltage reference other than the ground is required.

A problem that is however posed with the use of a MOS transistor as an input stage of the preamplifier has to do with the fact that this input stage operates under a constant current set by source 22. Indeed, for a null input voltage (Vin=0), the current of source 22 determines a drain-source voltage in the characteristic of MOS transistor 20. A problem that is then posed is that a variation of input voltage Vin translates as a variation of gate-source voltage Vgs of transistor 20, which implies that the operating point of the circuit does not follow the characteristic of the current as a function of the drain-source voltage at a constant Vgs. A non-linearity is thus introduced in the transistor's operation. This non-linearity risks causing signal distortion.

A first solution would be to use a channel of sufficient length to make output resistance Ro of transistor 20 in the saturated area (variation of drain-source voltage Vds divided by the variation of current Ids in the transistor) sufficiently large as compared to the input voltage. It would then be necessary to also increase the gate width to limit the increase of the gate-source voltage introduced by a channel of greater length. Further, an increase of the channel length and of the gate width results in an increase of the capacitance present on the transistor source. An increase of this capacitance slows down the response time of the input stage, which is not desirable for a fast preamplifier. This solution causing the increase of both the gate width and the channel length of the transistor is not ideal in that it results in very large dimensions and accordingly in a high power consumption if the rapidity and linearity characteristics of the desired input stage are desired to be maintained.

Thus, according to another feature of the present invention, an assembly in BICMOS technology is used to overcome the problem of the introduction of a MOS transistor in the preamplifier input stage, without it being necessary to increase the dimensions.

It should be noted that the current of source 22 must be sufficiently high, to be able to rapidly change the capacitances present on output node 24 (source of transistor 20). These capacitances have been symbolized in FIG. 4 by a capacitor C20 in dotted lines between node 24 and the ground. To avoid degrading the performance of PMOS transistor 20, the transistor substrate (for example, the well in which it is formed) must be connected to its source. The bulk-substrate capacitance of the transistor then is not negligible on output node 24 and contributes to the value of capacitor C20.

Figure 5:
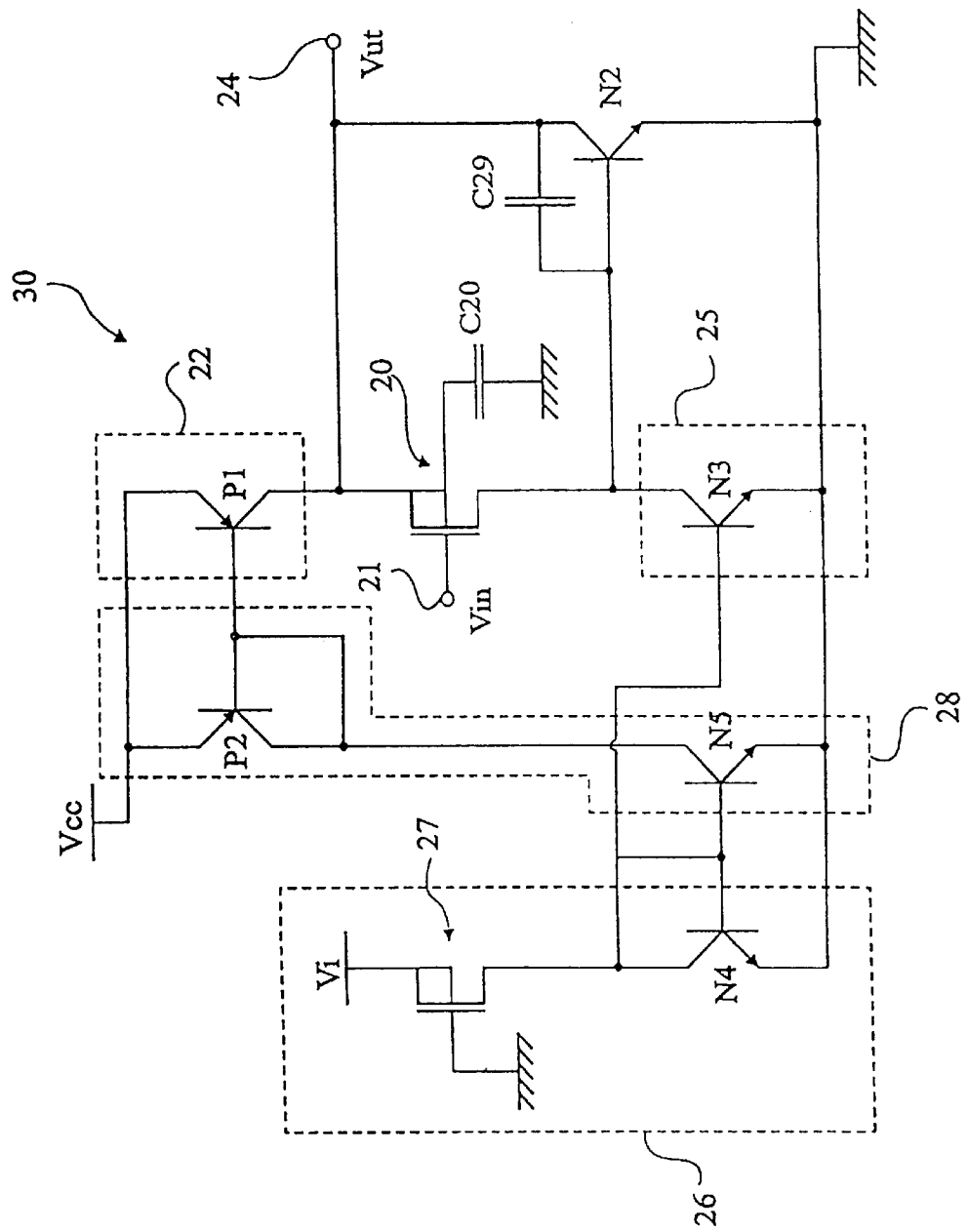
FIG. 5 is a detailed electric diagram of an embodiment of an input stage of a preamplifier according to the present invention.

FIG. 5 shows a detailed embodiment of an input stage of a video preamplifier according to the present invention, made in BICMOS technology. Input stage 30 is, like the assembly of FIG. 4, based on the use of a P-channel MOS transistor 20 receiving, on its gate 21, input signal Vin of the preamplifier referenced to the ground by means of a clamp 3' of the type discussed in relation with FIG. 4.

In the assembly of FIG. 5, capacitor C20 symbolizing all the capacitances of output node 24 of the input stage has been shown with a continuous line. This capacitor symbolizes, among others, the bulk-substrate capacitance of transistor 20, the input capacitance of differential stage 6 to which terminal 24 is connected, as well as the collector-substrate capacitances of transistors N2 and P1.

In the BICMOS technology implemented in FIG. 5, current source 22 is made in the form of a PNP-type transistor P1, the emitter of which is connected to supply voltage Vcc and the collector of which is connected to the source of transistor 20.

A feature of the BICMOS assembly of the present invention is to use an NPN-type bipolar transistor N2 to improve the rapidity of transistor 20 to accelerate its impulse response. Transistor N2 is connected between output terminal 24 and the ground, its emitter being grounded. The base of transistor N2 is connected to the drain of MOS transistor 20. An additional current source 25 is interposed between the drain of transistor 20 (and thus the base of transistor N2) and the ground to enable, in dynamic operation, the blocking of transistor N2 as will be seen hereafter. In static operation, current source 25 participates in the setting of gate-source voltage Vgs of transistor 20. Current source 25 is, preferably, formed of an NPN-type bipolar transistor N3, the collector of which is connected to the base of transistor N2 and the emitter of which is grounded.

Preferably, the gate-source voltage of transistor 20 is set to a reference value Vi by means of an assembly 26 including an NPN-type bipolar transistor N4 connected as a current mirror on transistor N3 and the collector of which is connected to the drain of a P-channel MOS transistor 27. The gate of transistor 27 is connected to ground and its source is connected to voltage Vi. Transistor 27 is permanently on, its gate being grounded. Its current is such that its gate-source voltage is equal to voltage Vi. This current in transistor 27 is copied in transistor N3 due to the current mirror assembly of transistor N3 and of transistor N4, the bases of transistors N3 and N4 being connected to the collector of transistor N4, the emitter of which is grounded. The current in MOS transistor 20 depends on the current in transistor N3 (neglecting the base current of transistor N2). Accordingly, if transistors 20 and 27 have the same dimensions (channel length and gate width), the gate-source voltage of transistor 20 will be equal to voltage Vi. The fact of controlling the gate-source voltage of transistor 20 enables optimizing the supply voltage of the assembly to the lowest possible voltage, while making it insensitive to possible technological and temperature dispersions.

In the preferred embodiment illustrated by FIG. 5, the current of source 22 is linked to the current of source 25 due to an assembly 28, formed of two current sources in series between the terminal of application of voltage Vcc and the ground. The two current sources are respectively connected as a current mirror on source 22 and on source 25. In the example shown, assembly 28 is formed of a PNP-type transistor P2 connected as a current mirror on transistor P1, the bases of transistors P1 and P2 being connected to the collector of transistor P2, the emitter of which is connected to voltage Vcc. The lower current source of assembly 28 is formed of an NPN-type transistor N5 mounted as a current mirror on transistor N3, the base of transistor N5 being connected to the collector of transistor N4 and its emitter being connected to ground while its collector is connected to the collector of transistor P2. Due to such an assembly, the current in source 22 is linked to the current in source 25, which avoids the influence of technological dispersions on the currents of the preamplifier of the present invention.

It should be noted that, in the case where transistor P1 is of sufficient size to provide enough current for transistor N3, capacitor C20, and transistor N2, assembly 28 then is not necessary.

Due to the response rapidity desired for the preamplifier, a capacitor C29 is connected between the collector and the base of transistor N2 to stabilize the loop formed by this transistor with transistor 20, and thus avoid oscillations.

One of the functions of transistor N2 is to discharge output capacitor C20 of the input stage of the preamplifier more rapidly when it is turned on. Such an operation occurs, in particular, in case of an increase of the drain-source current in transistor 20, which occurs, in transient state, in the form of an increase of its gate-source voltage before it is stabilized back by circuit 26. Thus, when voltage Vin decreases, voltage Vout decreases slower which, transiently, causes an increase of the gate-source voltage (in absolute value) and of the drain-source current of transistor 20 and thus turns transistor N2 on to more rapidly discharge output capacitor C20. Conversely, when voltage Vin increases, the voltage at node 24 increases slower due to the presence of capacitor C20. Transiently, the gate-source voltage of transistor 20 decreases like the current flowing therethrough. Since source 25 draws a predetermined fixed current, transistor N2 turns off as its base current disappears and the current set by source 22 is rapidly changed by capacitor C20 of output node 24.

It should be noted that the response time of the loop formed by transistors 20 and N2 is adjusted by capacitor C29 according to output capacitance C20 and thus, among others, to the input transistor of the differential stage (not shown in FIG. 5). Capacitor C29 is further used to correct a possible instability introduced by the geometry of MOS transistor 20, the dimensions of which are determined by the static circuit operation. In this static operation, its gate-source voltage is controlled by means of assembly 26. This further enables avoiding that the input transistor of the differential stage (6, FIG. 4) turns off in the presence of strong excursions of the video signal.

Although this has not been shown in the drawings, an assembly similar to that illustrated by FIG. 5 is reproduced on the side of reference input terminal 23 of differential stage 6 to make the assembly symmetrical. The only difference with respect to the circuit of FIG. 5 is that input 21 then is grounded on the side of reference 23.

An advantage of using an input signal aligned with respect to ground, in particular in the application to the video signal, is that this alignment may be performed by means of a simple switch, whereby the clamp is much simpler than in prior art.

Another advantage is that the input stage then has sufficiently large voltage drops to enable use of the circuit under a low supply voltage.

Of course, the present invention is likely to have various alterations, modifications, and improvements which will readily occur to those skilled in the art. In particular, the sizing of the different transistors of the input stage of the preamplifier of the present invention will be chosen according to the static and dynamic operation constraints of the application for which the assembly is intended, and this sizing is within the abilities of those skilled in the art based on the functional indications given hereabove. Further, although reference has been made in the foregoing description to an assembly in BICMOS technology, it should be noted that bipolar transistors N2, N3, N4, and N5 may be replaced with N-channel MOS transistors and that bipolar transistors P1 and P2 may be replaced with P-channel MOS transistors. However, for transistor N2, the replacement NMOS transistor will then have to fulfill the double condition of having its gate-source voltage only slightly greater than its threshold voltage and, in the technology used, that the threshold voltage of the P-channel MOS transistors be greater than that of the N-channel transistors. Otherwise, the operating condition of the circuit with a bipolar transistor N2 (Vgs+Vin−Vbe >VgsVt, where Vgs is the gate-source voltage (in absolute value) of transistor 20, Vt its threshold voltage, and Vbe the base-emitter voltage of transistor N2), which is fulfilled since threshold voltage Vt of transistor 20 is greater than the base-emitter voltage Vbe of transistor N2, is no longer fulfilled once transposed to the case of an NMOS transistor instead of transistor N2.

Further, although the present invention has been described in relation with an application to the analog processing of video signals, it should be noted that the provided fast linear preamplifier assembly can find other applications in which similar problems are posed. For example, it may be desired to use such an assembly in the analog processing of signals other than video signals where it is desired to combine the rapidity, the linearity, a null input current, and a small supply voltage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A preamplifier including an input stage adapted to receiving an analog signal via a connection capacitor, and a differential output stage adapted to providing said signal referenced with respect to a predetermined level, including means for enabling the input stage to accept a signal referenced to the differential stage ground, the signal provided by the output stage being referenced to this ground.

2. The preamplifier of claim 1, wherein the input stage includes a first MOS transistor, the gate of which receives said input signal referenced to ground, in series with a first current source, the midpoint between said current source and said transistor defining the output terminal of the preamplifier input stage.

3. The preamplifier of claim 2, including a switching means for drawing the output of the input stage to the ground.

4. The preamplifier of claim 3, wherein said switching means is formed of a second transistor, the control terminal of which is connected to the drain of the first input MOS transistor.

5. The preamplifier of claim 2, including means for setting, in static operation, the gate-source voltage of the first MOS transistor to a predetermined value.

6. The preamplifier of claim 5, wherein said means is formed of a second current source, connected between the drain of the first MOS transistor and the ground, this second source being mounted as a current mirror on a third current source, the current of which is determined by a third MOS transistor with a constant gate-source voltage.

7. The preamplifier of claim 6, including a second transistor of NPN-type as well as transistors constitutive of the second and third current sources, the first current source being formed of a PNP-type bipolar transistor.

8. The preamplifier of claim 6, wherein the currents of the first and second sources are linked to each other via a current mirror assembly.

9. The preamplifier of claim 2, including a stabilization capacitor between the source and the drain of the first MOS transistor.

10. An analog processing circuit for processing a video signal including the preamplifier of claim 1.

* * * * *